United States Patent [19]
Rhee

[11] Patent Number: 5,608,673
[45] Date of Patent: Mar. 4, 1997

[54] NAND-TYPE FLASH MEMORY INTEGRATED-CIRCUIT CARD

[75] Inventor: Won-woo Rhee, Kyungki-do, Rep. of Korea

[73] Assignee: Samsung Electronics Co., Ltd., Suwon-city, Rep. of Korea

[21] Appl. No.: 507,689

[22] Filed: Jul. 25, 1995

[30] Foreign Application Priority Data

Jul. 25, 1994 [KR] Rep. of Korea .................. 94-17996

[51] Int. Cl.$^6$ ............................................. G11C 11/34
[52] U.S. Cl. ............................ 365/185.33; 365/185.17
[58] Field of Search ...................... 365/185.33, 185.17, 365/230.03, 230.08, 230.06

[56] References Cited

U.S. PATENT DOCUMENTS 5,428,566  6/1995  Robinson ........................ 365/230.03
5,428,579  6/1995  Robinson ........................ 365/185.33

Primary Examiner—A. Zarabian
Attorney, Agent, or Firm—Cushman Darby & Cushman, IP Group Of Pillsbury Madison & Sutro LLP

[57] ABSTRACT

A NAND-type flash memory integrated circuit card is composed of an input and output bus having first lines for a plurality of NAND-type flash memory components having first and second groups, first lines for zone address data, instruction data, address data and information data, and second lines for the information data only, a first buffer for transmitting the data between the first lines and the NAND-type flash memory components of the first group, a second buffer for transmitting the data between the first lines and the NAND-type flash memory components of the second group, a third buffer for transmitting the data between the second lines and the NAND-type flash memory components of the second group, and a controller for enabling one of the plurality of the NAND-type flash memory components according to the mode control signal, the zone address data and the address data, and one of the first through third latches, in order to instruct one mode among a word mode, a half-word mode for upper eight bits, a byte mode, and a standby mode for awaiting a data input and output with respect to all the NAND-type flash memory components, and for storing and outputting the information data according to the instruction data and the address data applied via the input and output bus. The NAND-type flash memory IC card can be made into a large capacity, and provides an effect of storing and outputting data which is transmitted in parallel in units of a word or a byte.

13 Claims, 5 Drawing Sheets

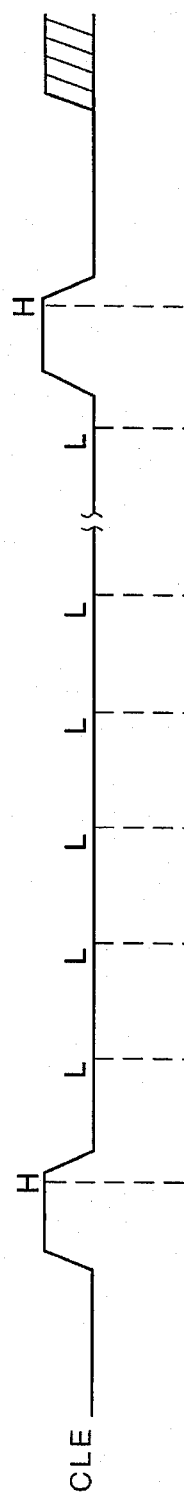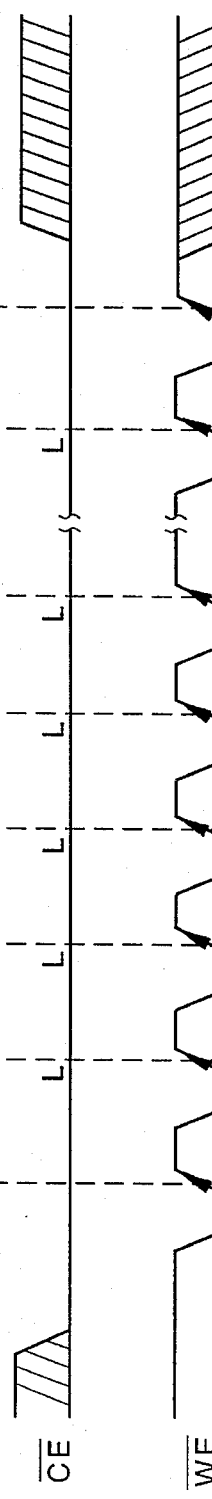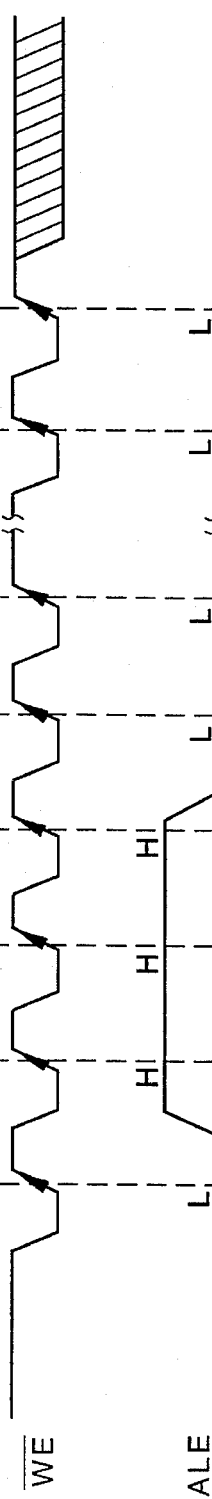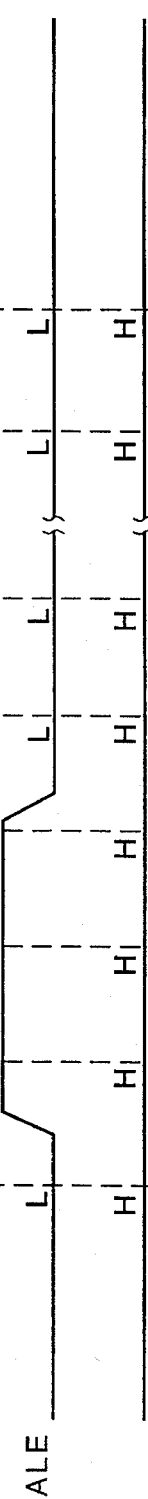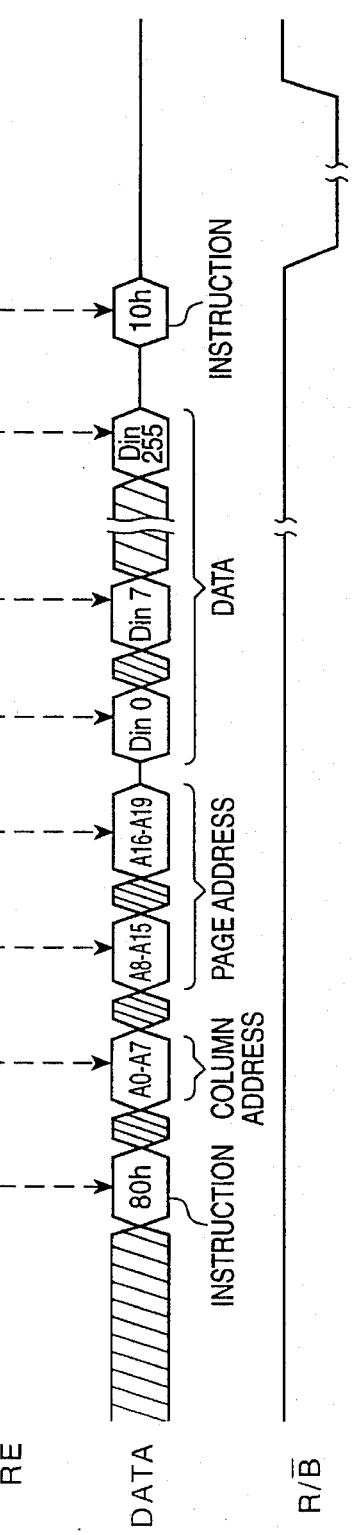

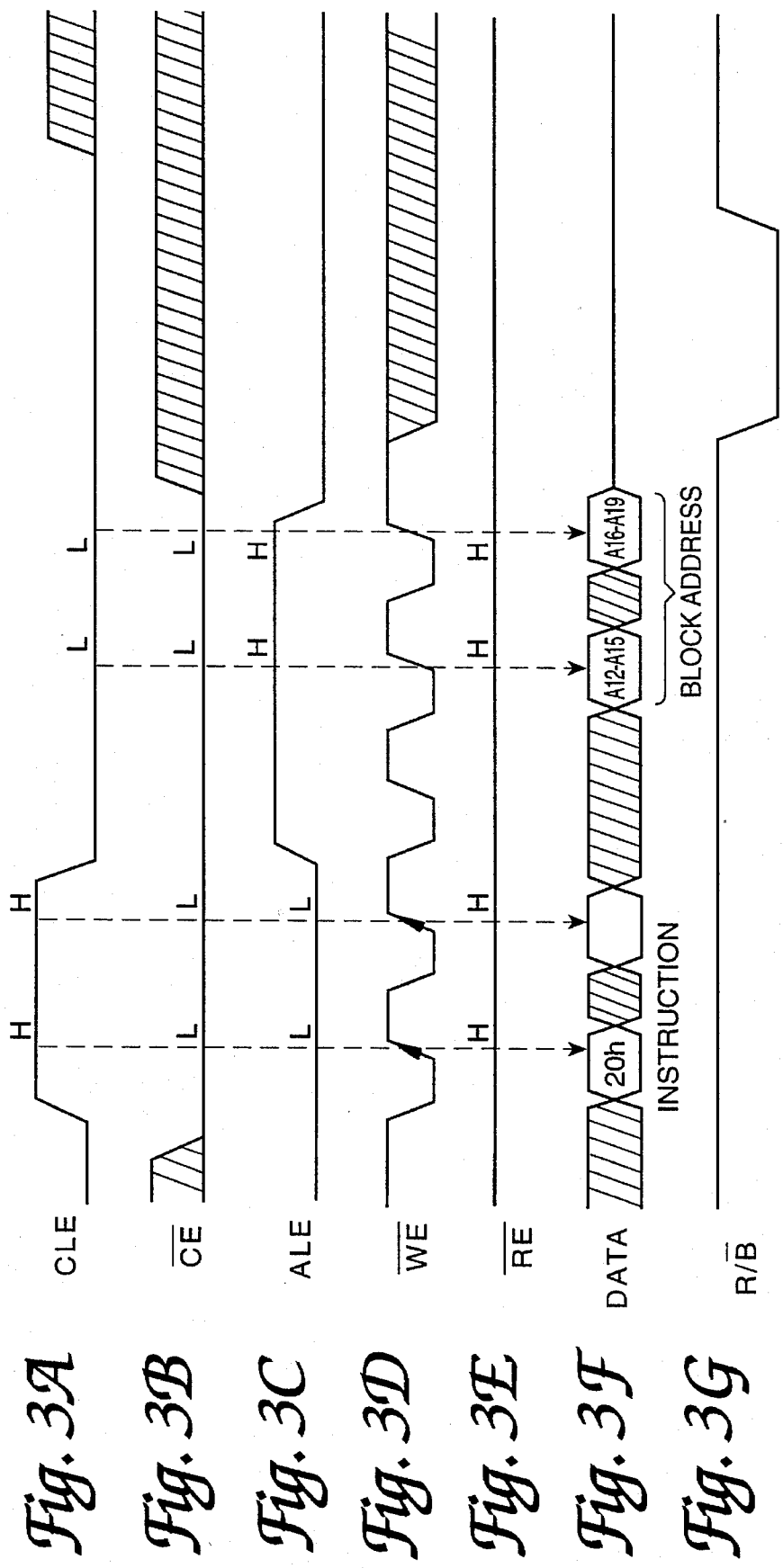

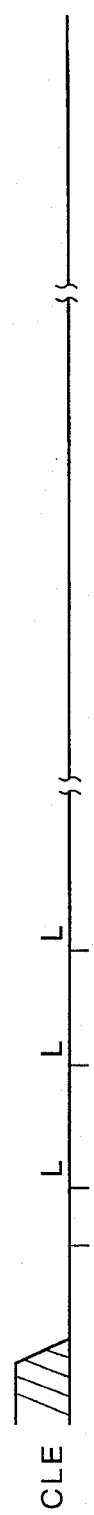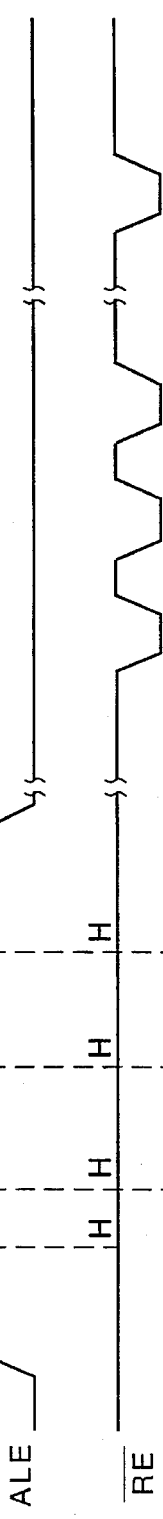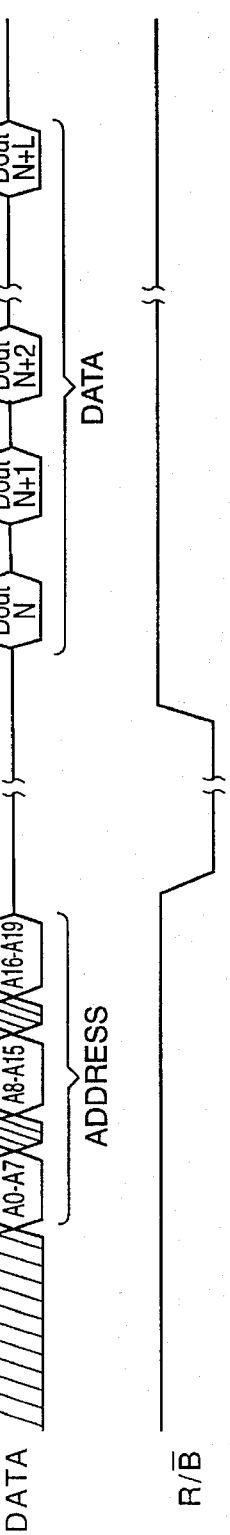

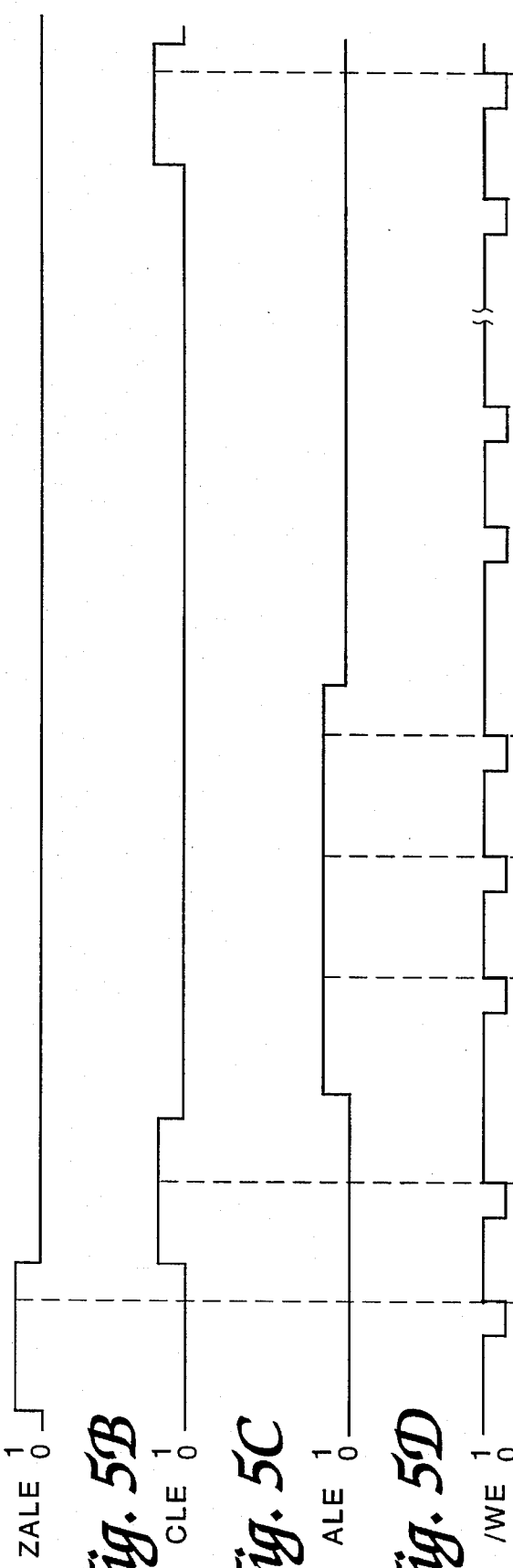

NAND-TYPE FLASH MEMORY INTEGRATED-CIRCUIT CARD

BACKGROUND OF THE INVENTION

1. Field of the Invention

The present invention relates to a storage medium having a NAND-type flash memory, and more particularly, to a NAND-type flash memory integrated-circuit (IC) card having a plurality of NAND-type flash memory components for storing information.

2. Description of the Related Art

The flash memory is a kind of non-volatile memory in which stored information is not volatile even though power is turned off, differently from a dynamic random access memory (DRAM) or a static random access memory (SRAM). The flash memory does not need a particular battery to keep the stored information. Also, the flash memory does not occupy a large space nor consume a large amount of power in use. Also, the flash memory enables high speed programming. Because of these advantages, the flash memory is widely used in various apparatuses such as still cameras and an electronic games as well as mini-computers, a workstations and a memory cards.

There are two kinds of the flash memory, that is, a NOR-type and a NAND-type which are classified according to a memory access method. The NOR-type flash memory has a structure having an address bus, a data bus and a control bus which separately exist. On the contrary, the NAND-type flash memory transmits instructions, addresses and data via an input/output bus and uses a particular control signal for discerning information transmitted via the input/output bus.

When flash memories are used as storage media, it is desirable that such storage media be manufactured as a miniature IC card such as a magnetic tape or a compact disk which is attached to and detached from a system. The IC card having a plurality of flash memory components needs a control apparatus for controlling the memory components. The IC card having the NOR-type flash memory components has an advantage in that larger data storage capacities require more access address pins, although such components have been manufactured and used by the INTEL company. However, an IC card having NAND-type flash memory components has not yet been manufactured. Thus, there remains a need for a storage medium using NAND-type flash memory as a storage medium.

SUMMARY OF THE INVENTION

Therefore, to solve the above problems, it is an object of the present invention to provide a storage medium having a NAND-type flash memory which can be used as a large-scale storage medium by enabling write-in, erasure and read-out operations of information with respect to a flash memory according to a control signal supplied from an application product which uses the NAND-type flash memory.

To accomplish the above object of the present invention, there is provided a storage medium comprising:

an input and output bus for receiving zone address data, instruction data, address data and information data, and outputting the information data;

a plurality of NAND-type memory components for discerning the input data supplied via the input and output bus into the instruction data, the address data and the information data according to an instruction latch enable signal, an address latch enable signal, a write-in enable signal and a read-out enable signal which are input to each memory component, and storing, erasing and outputting the information data according to the discerned instruction data and address data; and a controller for enabling one of the plurality of the NAND-type flash memory components according to the address data discerned by a zone address latch enable signal among the input data supplied via the input and output bus.

The above object of the present invention can be accomplished by providing another storage medium comprising:

an input and output bus having first lines for receiving zone address data, instruction data, address data and information data, and outputting the information data, and second lines for receiving and outputting the information data;

first and second buffers for buffering the data of the first lines in the input and output bus;

a third buffer for buffering the data of the second lines in the input and output bus;

a plurality of NAND-type memory components for discerning the input data supplied via a corresponding buffer into the instruction data, the address data and the information data according to an instruction latch enable signal, an address latch enable signal, a write-in enable signal and a read-out enable signal which are input to each NAND-type flash memory component, and storing, erasing and outputting the information data according to the discerned instruction data and address data due to the discerned result, and having a first group which includes NAND-type flash memory components which exchange the data with the input and output bus via the first buffer and a second group which includes NAND-type flash memory components which exchange the data with the input and output bus via the second and third buffers; and a controller for enabling one of the plurality of the NAND-type flash memory components according to the zone address data and the address data which are individually discriminated from the input data supplied via the input and output bus according to a mode control signal, a zone address latch enable signal and an address latch enable signal, in order to instruct one mode among a word mode for writing and reading the information data which is transmitted in parallel in units of a word having sixteen bits, a half-word mode for writing and reading the information data having only upper eight bits from the most significant bit (MSB) of data which is transmitted in parallel in units of a word, a byte mode for writing and reading the information data which is transmitted in parallel in units of a byte composed of eight bits, and a standby mode for awaiting a data input and output with respect m all the NAND-type flash memory components.

BRIEF DESCRIPTION OF THE DRAWINGS

The preferred embodiments are described with reference to the drawings wherein:

FIGS. 2A through 2G are waveform diagrams for explaining a write-in operation with respect to the NAND-type flash memory component.

FIGS. 3A through 3G are waveform diagrams for explaining an erasure operation with respect to the NAND-type flash memory component.

FIGS. 4A through 4G are waveform diagrams for explaining a read-out operation with respect to the NAND-type flash memory component.

FIGS. 5A through 5F are waveform diagrams which relate to a write-in operation with respect to the integrated circuit card of FIG. 1.

DETAILED DESCRIPTION OF THE PREFERRED EMBODIMENT

Figure 1:
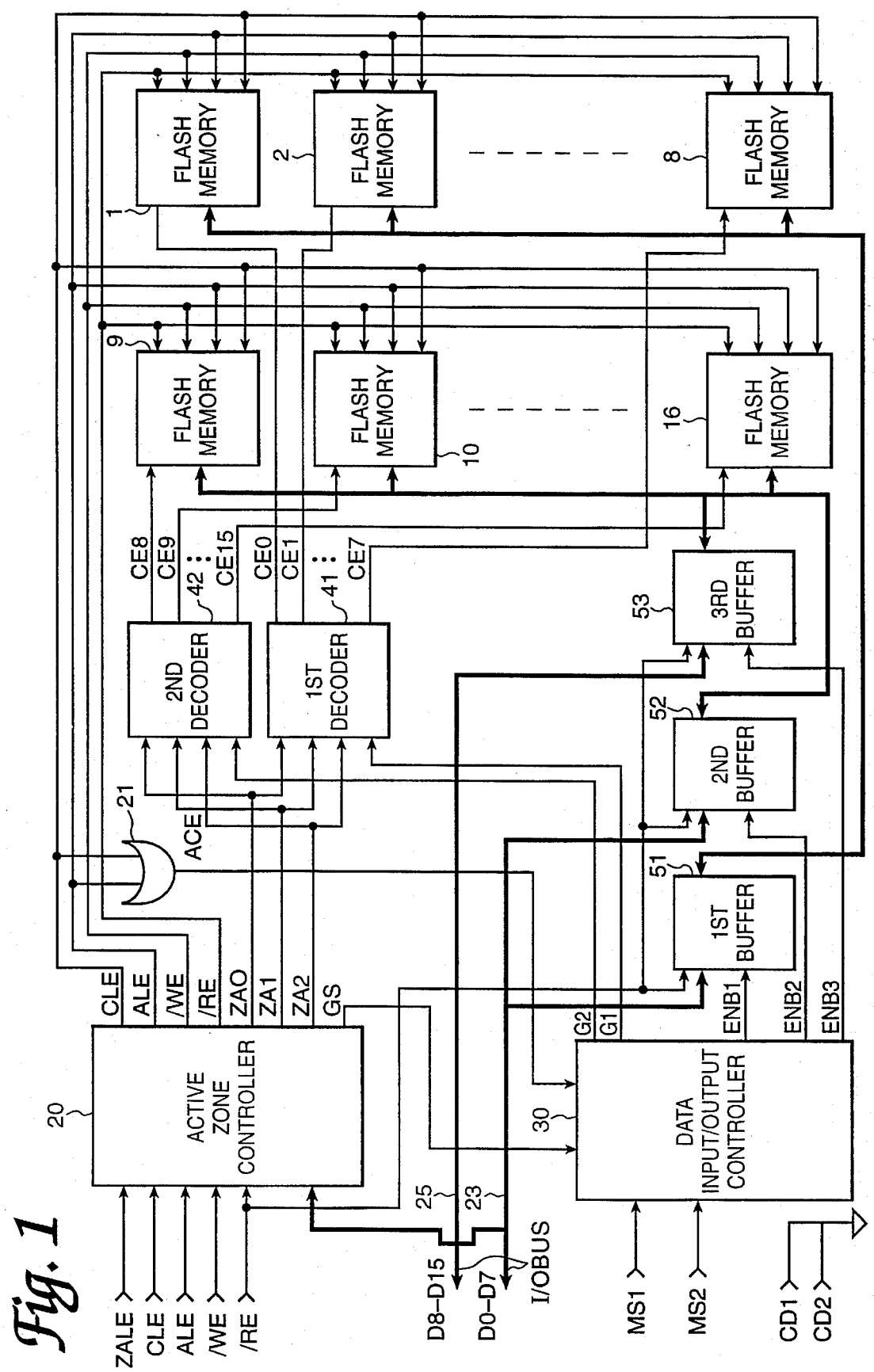
FIG. 1 is a block diagram showing a NAND-type flash memory integrated circuit card according to one embodiment of the present invention.

A preferred embodiment of the present invention will be described below in more detail with reference to the accompanying drawings FIGS. 1 through 5F.

FIG. 1 is a block diagram showing a NAND-type flash memory integrated circuit (IC) card 100 according to one embodiment of the present invention. The electronic product in which the IC card 100 of FIG. 1 is mounted detects whether the IC card 100 is installed on the basis of IC card installation detection signals CD1 and CD2 via pins (not shown). The electronic product gives data to IC card 100 and takes the data from IC card 100 via an input/output (I/O) bus. The electronic product supplies a zone address latch enable signal ZALE, an instruction latch enable signal CLE, an address latch enable signal ALE, a write-in enable signal /WE and a read-out enable signal /RE to active zone controller 20, and supplies mode control signals MS1 and MS2 to a data input/output (I/O) controller 30. The I/O bus is comprised of eight first lines 23 for transmitting zone address data, instruction data, address data and information data, and eight second lines 25 for transmitting information data only. First lines 23 of the I/O bus are connected to active zone controller 20, a first buffer 51 and a second buffer 52, and second lines 25 thereof are connected to a third buffer 53. First buffer 51 is connected respectively to eight NAND-type flash memory components 1 through 8 via an internal bus having eight lines, and second and third buffers 52 and 53 are also connected respectively to eight NAND-type flash memory components 9 through 16 via an internal bus having eight lines. By this connection, first buffer 51 supplies the same data to eight NAND-type flash memory components 1 through 8, and second and third buffers 52 and 53 supply the same data to eight NAND-type flash memory components 9 through 16, respectively.

NAND-type flash memory components 1 through 16 process data applied via the internal bus on the basis of instruction latch enable signal CLE, address latch enable signal ALE, write-in enable signal /WE and read-out enable signal /RE supplied from active zone controller 20. The above-described signals CLE, ALE, /WE and /RE are individually supplied to sixteen NAND-type flash memories 1 through 16. The sixteen NAND-type flash memory components 1 through 16 according to one embodiment of the present invention have a data storage capacity of 1 Mbyte. The NAND-type flash memory components 1 through 16 are classified into a first group having NAND-type flash memory components 1 through 8 which are enabled by a first decoder 41, and a second group having NAND-type flash memory components 9 through 16 which are enabled by a second decoder 42. First decoder 41 generates enable signals CE0 through CE7 for individually enabling NAND-type flash memory components 1 through 8, and second decoder 42 generates enable signals CE8 through CE16 for enabling NAND-type flash memory components 9 through 16. The decoders 41 and 42 are enabled respectively by enable signals G1 and G2 applied from data I/O controller 30. Decoders 41 and 42 receive the same zone address data ZA0–ZA2 from active zone controller 20. Data I/O controller 30 generates enable signals G1, G2, ENB1, ENB2 and ERB3 according to a group select signal GS supplied from active zone controller 20, mode control signals MS1 and MS2, and a binary signal ACE supplied from an OR gate 21. Enable signals ENB1, ENB2 and ENB3 individually enable first through third buffers 51, 52 and 53.

IC card 100 according to one embodiment of the present invention having the above structure is electrically connected to the electronic product in which IC card 100 is installed by means of sixteen external pins (not shown) for the I/O bus, external pins (not shown) for each signal ZALE, CLE, ALE, /WE or /RE supplied from active zone controller 20, and external pins (not shown) for mode control signals MS1 and MS2.

Prior to describing an operation of the IC card 100 of FIG. 1, the write-in, erasure and read-out operations of NAND-type flash memory components 1 through 16 will be described below with reference to FIGS. 2A through 2G, 3A through 3G and 4A through 4G. Since NAND-type flash memory components 1 through 16 perform the same operation with respect to the waveform diagrams shown in FIGS. 2A through 2G, 3A through 3G and 4A through 4G. an operation of only NAND-type flash memory component 1 is described. Here, all the NAND-type flash memory components 1 through 16 are enabled so that the write-in, erasure and read-out operations are performed by low-level enable signal /CE which is applied to each enable signal input end thereof from decoder 41 or 42.

FIGS. 2A through 2G are waveform diagrams for explaining a write-in operation with respect to the NAND-type flash memory component 1. The cross-hatched portions shown in FIGS. 2A through 2C and 2F correspond to "don't care" regions. Such "don't care" regions are represented as cross-hatched portions in the drawings which relate to the erasure and read-out operations. NAND-type flash memory component 1 latches data input according to write-in enable signal /WE and discriminates the latched data on the basis of instruction latch enable signal CLE and address latch enable signal ALE. NAND-type flash memory component 1 stores the instruction data according to the address data which is discriminated by address latch enable signal ALE of FIG. 2D, if the latched instruction data has a value of "80hex" as the write-in instruction data. The address data is composed of a "page address" called a "column address" and a "row address." Thus, the instruction data of 1 Mbyte is stored in the NAND-type flash memory component 1, using 8-bit column address data A0–A7 and 12-bit page address data A12–A19. The NAND-type flash memory component 1 using such address data stores the data of 1 Mbyte in units of a page composed of 256 bytes, and stores data as much as one page starting at a column of the page designated by a page address and a column address. FIGS. 2C and 2E show the waveform diagrams of the write-in enable signal /WE and the read-out enable signal /RE during performance of the write-in operation in the NAND-type flash memory component 1, respectively. As shown in FIG. 2F, when a value of "10hex" representing the data transmission completion follows the data corresponding to one page, NAND-type flash memory component 1 completes the write-in operation on the basis of a value of the data latched according to instruction latch enable signal CLE. Signals R/B bar respectively shown in FIGS. 2G, 3G and 4G represent a ready/busy signal which is usually used in connection with a memory.

NAND-type flash memory component 1 erases the information data stored by the write-in operation according to erasure instruction data and block address data. FIGS. 3A through 3G show waveform diagrams for explaining the erasure operation of NAND-type flash memory component 1. NAND-type flash memory component 1 uses address data during a high-level of address latch enable signal ALE to perform an erasure operation, if the instruction data has block erasure instruction values of "20hex" and "D0hex" during a high-level of instruction latch enable signal CLE, among the data latched by the write-in enable signal /WE. The erasure operation is performed in units of a "block" composed of an amount of data of the sixteen pages of 4 Kbyte. Thus, the 8-bit address data A12–A19 is used to erase all the information data stored in NAND-type flash memory component 1.

NAND-type flash memory component 1 outputs the information data stored by the write-in operation according to the address data. FIGS. 4A through 4G show waveform diagrams for explaining a read-out operation with respect to the NAND-type flash memory component. NAND-type flash memory component 1 uses address data during a high-level of address latch enable signal ALE among the data latched by write-in enable signal /WE to output the stored data. The address data for the read-out operation is composed of 8-bit column address data A0–A7 and 12-bit page address data A8–A19, as in the write-in operation. The operation of the IC card 100 of FIG. 1 having the above-described NAND-type flash memory components 1 through 16 will be described below with reference to FIGS. 5A through 5F.

Active zone controller 20 latches data supplied via first lines 23 in I/O bus according to write-in enable signal /WE. Active zone controller 20 judges the data among the latched data during a high-level of zone address latch enable signal ZALE as zone address data ZA0-ZA2, and outputs the latched zone address data ZA0-ZA2 to first and second decoders 41 and 42. Decoders 41 and 42 enable one or two of 16 flash memory components m be active. Active zone controller 20 latches the instruction data judged by instruction latch enable signal CLE and the address data A0-A20 judged by address latch enable signal ALE according to write-in enable signal /WE. Active zone controller 20 generates a group select signal GS on the basis of the latched instruction data and the address data. Group select signal GS represents which group of the NAND-type flash memory component among the first and second groups will be used for the write-in and read-out operations of the information data transmitted/n units of a byte with respect to IC card 100. The group select signal GS has a low-level value when IC card 100 uses the NAND-type flash memory components 1 through 8 of the first group. On the other hand, the group select signal GS has a high-level value when IC card 100 uses only the NAND-type flash memory components 9 through 18 of the second group. Thus, when the whole lines of the I/O bus are used for parallel transmission of the information data, or the first lines 23 of the I/O bus are used for parallel transmission of the information data, group select signal GS has a low-level value. Meanwhile, when only the second lines 25 of the I/O bus are used for parallel transmission of the information data, group select signal GS has a high-level value. Active zone controller 20 outputs group select signal GS generated on the basis of the address data to data I/O controller 30. On the other hand, OR gate 21 logically sums instruction latch enable signal CLE and address latch enable signal ALE output from active zone controller 20, and outputs a binary signal ACE resulting from the logical summation to data I/O controller 30. The binary signal ACE has a high-level value during a time when instruction latch enable signal CLE or address latch enable signal ALE is applied, while the former has a low-level value during a time when both signals are not applied. The binary signal ACE represents whether the current data is an address or an instruction, or information data.

If mode control signals MS1 and MS2 are applied to data I/O controller 30, data I/O controller 30 applies group select signal GS supplied from active zone controller 20, binary signal ACE supplied from OR gate 21 and mode control signals MS1 and MS2 to an internal logic table to generate enable signals G1, G2, ENB1, ENB2 and ENB3. The logic table contained in data I/O controller 30 is shown in Table 1.

The mode control signals MS1 and MS2 supplied to data I/O controller 30 determine a word mode, a half-word mode, a byte mode and a standby mode according to a combination of the binary values of mode control signals MS1 and MS2. Here, the word mode is for writing and reading the information data which is transmitted in parallel in units of a word composed of sixteen bits. The half-word mode is for writing and reading only the upper eight bits from the most significant bit (MSB) of the information data which is transmitted in parallel in units of a word. The byte mode is for writing and reading the information data which is transmitted in parallel in units of a byte composed of eight bits. Finally, the IC card 100 does not perform any operations in the standby mode.

TABLE 1

|  | ACE | GS | CE2 | CE1 | ENB1 | ENB2 | ENB3 | G1 | G2 |
| --- | --- | --- | --- | --- | --- | --- | --- | --- | --- |
| WORD | L | L | L | L | L | H | L | H | H |
| HALF | L | L | L | H | H | H | L | H | L |
| BYTE | L | L | H | L | L | H | H | L | H |
| STAND-BY | L | L | H | H | H | H | H | L | L |
| WORD | L | H | L | L | L | H | L | H | H |
| HALF | L | H | L | H | H | H | L | H | L |
| BYTE | L | H | H | L | H | L | H | H | L |
| STAND-BY | L | H | H | H | H | H | H | L | L |
| W-CMD | H | L | L | L | L | L | H | H | H |
| H-CMD | H | L | L | H | H | H | L | H | L |
| B-CMD | H | L | H | L | L | H | H | L | H |
| STAND-BY | H | L | H | H | H | H | H | L | L |
| W-CMD | H | H | L | L | L | L | H | H | H |
| H-CMD | H | H | L | H | H | H | L | H | L |

TABLE 1-continued

|  | ACE | GS | CE2 | CE1 | ENB1 | ENB2 | ENB3 | G1 | G2 |
|---|---|---|---|---|---|---|---|---|---|
| B-CMD | H | H | H | L | H | L | H | H | L |
| STAND-BY | H | H | H | H | H | H | H | L | L |

The first and second decoders 41 and 42 are enabled if the enable signals G1 and G2 supplied from data I/O controller 30 have high-level values, respectively. If the enable signals G1 and G2 have low-level values, the first and second decoders 41 and 42 are disabled. The first and second decoders can be embodied using an integrated circuit (IC) chip No. "74HC138." First decoder 41 or second decoder 42 which is enabled by enable signal G1 or G2, decodes zone address data ZA0–ZA2 applied from active zone controller 20, and enables a corresponding NAND-type flash memory component on the basis of the decoding result. Thus, when first decoder 41 is enabled, first decoder 41 enables one of the NAND-type flash memory components 1 through 8 of the first group. The second decoder 42 is the case similar to the first decoder 41. On the other hand, first through third buffers 51 through 53 are individually enabled by the low-level enable signals ENB1, ENB2 and ENB3 supplied from data I/O controller 30, respectively. The buffers 51 through 53 can be embodied using an IC chip No. "74HC245". Each of buffers 51 through 58 is activated when a corresponding enable signal (ENB1, ENB2, or ENB3) is at low-level.

For better understanding the signals output from data I/O controller 30 using Table 1, a case that mode control signals MS1 and MS2 for the byte mode, group select signal GS having the low-level value and binary signal ACE having the low-level value are applied to data I/O controller 30, will be described below. In this case, data I/O controller 30 enables nothing but first buffer 51 and first decoder 41. Thus, the write-in and read-out operations of the information data are performed with respect to the NAND-type flash memory component designated by zone address data ZA0–ZA2 among the NAND-type flash memory components 1 through 8. Anyone having an ordinary skill in the art can understand well the operation of data I/O controller 30 and furthermore the operation of the FIG. 1 apparatus on the basis of the logic Table 1. The IC card 100 stores the information data transmitted in parallel in units of a byte in the NAND-type flash memory component of the first group or the NAND-type flash memory component of the second group. IC card 100 stores the information data transmitted in parallel in units of a word composed of sixteen bits in the NAND-type flash memory component of the first group or the NAND-type flash memory component of the second group. IC card 100 also stores only the upper eight bits of the information data transmitted in parallel in units of a word composed of sixteen bits in the NAND-type flash memory component of the second group. For reference, the waveform diagrams shown in FIGS. 5A through 5F are for explaining the write-in operation of IC card 100 of FIG. 1.

In case that a value of the instruction data latched in active zone controller 20 is erasure instruction data, IC card 100 of FIG. 1 performs an erasure operation on the basis of the latched zone address data ZA0–ZA2, instruction data and address data. The erasure operation is accomplished by using addresses with respect to the blocks composed of sixteen pages, as in the individual NAND-type flash memory component. Thus, IC card 100 can perform an erasure operation with respect to NAND-type flash memory components 1–8 or 9–16 of each group, by designating only a variable zone address in addition to the same erasure instruction data and the block address.

The above-described embodiment of the present invention uses eight NAND-type flash memory components of each group. However, various modifications having more than eight in the number of NAND-type flash memory components of each group are possible by increasing only the number of the bits for designating the zone address.

As described above, the storage medium of the present invention contains a number of the NAND-type flash memory components, and embodies an apparatus for controlling the data input/output with respect to the respective components. Accordingly, the information data transmitted in parallel in units of a word can be stored and outputted, and functions which are not provided by only an individual NAND-type flash memory component can be provided, As well, such a storage medium can be made into an IC card to thereby conveniently use a storage medium having a large capacity.

While only certain embodiments of the invention have been specifically described herein, it will apparent that numerous modifications may be made thereto without departing from the spirit and scope of the invention.

What is claimed is:

1. A storage medium comprising:

an input and output bus for commonly receiving zone address data, instruction data, address data and information data from an external source, and for outputting the information data to the external source;

a plurality of flash memory components which receive data commonly supplied via the input and output bus and which discriminate between the instruction data, the address data and the information data according to an instruction latch enable signal, an address latch enable signal, a write-in enable signal and a read-out enable signal, all of which are input to each memory component, and which store, erase and output the information data according to the instruction data and address data; and a controller for enabling a corresponding one of the plurality of flash memory components according to the address data received via the input and output bus and a zone address latch enable signal.

2. The storage medium according to claim 1, wherein the controller comprises:

first means for detecting the zone address data during a high-level of the zone address latch enable signal and for outputting the zone address data according to the detection; and second means for enabling one of the flash memory components corresponding to the zone address data output from the first means.

3. The storage medium according to claim 2, wherein the first means receives the zone address latch enable signal, the instruction latch enable signal, the address latch enable signal, the write-in enable signal and the read-out enable signal and supplies the instruction latch enable signal, the address latch enable signal, the write-in enable signal and the read-out enable signal to each of the flash memory components.

4. The storage medium according to claim 1, wherein said storage medium is an integrated circuit card.

5. The storage medium according to claim 4, wherein said integrated circuit card comprises external pins for the zone address latch enable signal, the instruction latch enable signal, the address latch enable signal, the write-in enable signal and the read-out enable signal and other external pins for said input and output bus.

6. A storage medium comprising:

an input and output bus having first lines for commonly receiving zone address data, instruction data, address data and information data from an external source, and outputting the information data to the external source, and second lines for receiving and outputting the information data from and to the external source;

first and second buffers for buffering the data of the first lines of the input and output bus;

a third buffer for buffering the data of the second lines of the input and output bus;

a plurality of flash memory components which receive data commonly supplied via a corresponding buffer and which discriminate between instruction data, the address data and the information data according to an instruction latch enable signal, an address latch enable signal, a write-in enable signal and a read-out enable signal, all of which are input to each flash memory component, and which store, erase and output the information data according to the instruction data and address data, the plurality of flash memory components having a first group which includes corresponding ones of the flash memory components which exchange data with the input and output bus via the second and third buffers; and a controller for enabling a corresponding one of the plurality of flash memory components according to the zone address data and the address data which are individually discriminated from the data commonly supplied via the input and output bus according to a mode control signal, a zone address latch enable signal and an address latch enable signal, and for selectively controlling one mode among a word mode for writing and reading the information data which is transmitted in parallel in units of a word having sixteen bits, a half-word mode for writing and reading the information data having only upper eight bits from the most significant bit (MSB) of data which is transmitted in parallel in units of a word, a byte mode for writing and reading the information data which is transmitted in parallel in units of a byte composed of eight bits, and a standby mode for awaiting data input and output with respect to all of the flash memory components.

7. The storage medium according to claim 6, wherein the controller comprises:

an active zone controller for discriminating between the zone address data and the address data from the data commonly supplied via the input and output bus on the basis of the zone address latch enable signal and the address latch enable signal, and for outputting the zone address data and a group select signal for selecting a group including at least one of the flash memory component, activated on the basis of the zone address data and the address data;

an OR gate which logically sums the instruction latch enable signal and the address latch enable signal supplied to all of the flash memory components, and which outputs a binary signal resulting from the logical summation;

a first decoder for enabling one of the flash memory components of the first group according to the zone address data supplied from the active zone controller;

a second decoder for enabling one of the flash memory components of the second group according to the zone address data supplied to the first decoder; and a data input and output controller for selectively enabling the first through third buffers and the first and second decoders on the basis of the group select signal, the binary signal and the mode control signal.

8. The storage medium according to claim 7, wherein said group select signal indicates that only the flash memory components of the second group are used.

9. The storage medium according to claim 7, wherein each of the first and second decoders is coupled to each of the flash memory components, so that one of the flash memory components belonging to the first group and one of the flash memory components belonging to the second group corresponding to the first group are both enabled with respect to a corresponding value of the zone address data.

10. The storage medium according to claim 9, wherein the data input and output controller enables the first and third buffers and the first and second decoders when the mode control signal indicates the word mode, and the binary signal has a first value representing that one of the instruction latch enable signal and the address latch enable signal is not supplied to the flash memory components, enables the first and second buffers and first and second decoders when mode control signal indicates the word mode, and the binary signal has a second value representing that one of the instruction latch enable signal and the address latch enable signal is supplied to the flash memory components, enables the third buffer and the second decoder when the mode control signal indicates the half-word mode, enables the first buffer and the first decoder when the mode control signal indicates the byte mode, and the group select signal selects the first group, enables the second buffer and the second decoder when the mode control signal indicates the byte mode, and the group select signal selects the second group, and disables the first and second decoders and the first through third buffers when the mode control signal indicates the standby mode.

11. The storage medium according to claim 6, wherein said storage medium is an integrated circuit card.

12. The storage medium according to claim 11, wherein said integrated circuit card comprises external pins for the zone address latch enable signal, the instruction latch enable signal, the address latch enable signal, the write-in enable signal and the read-out enable signal and other external pins for said input and output bus.

13. The storage medium according to claim 6, wherein the controller enables both one of the flash memory components belonging to the first group and one of the flash memory components belonging to the second group corresponding to the first group when the mode control signal indicating the word mode is applied thereto, enables one of the flash memory components belonging to the second group when the mode control signal indicating the half-word mode is applied thereto, and enables one of the NAND-type flash memory components belonging to one of the first and second groups when the mode control signal indicating the byte mode is applied thereto.

* * * * *